United States Patent [19]
Tsukamoto

[11] Patent Number: 6,025,652
[45] Date of Patent: Feb. 15, 2000

[54] SEMICONDUCTOR DEVICE AND METHOD OF PRODUCING SAME

[75] Inventor: Kazuhiro Tsukamoto, Tokyo, Japan

[73] Assignee: Mitsubishi Denki Kabushiki Kaisha, Tokyo, Japan

[21] Appl. No.: 09/081,680

[22] Filed: May 20, 1998

[30] Foreign Application Priority Data

Dec. 17, 1997 [JP] Japan ..................................... 9-348267

[51] Int. Cl.⁷ ......................... H01L 23/544; H01L 23/48
[52] U.S. Cl. ............................................. 257/797; 257/734
[58] Field of Search ..................................... 257/734, 296, 257/306, 308, 309, 797, 310; 430/317

[56] References Cited

U.S. PATENT DOCUMENTS 5,503,962  4/1996  Caldwell ................................. 430/317

FOREIGN PATENT DOCUMENTS 7-142379  6/1995  Japan ....................................... 257/797

*Primary Examiner*—Steven H. Loke
*Attorney, Agent, or Firm*—McDermott, Will & Emery

[57] ABSTRACT

In a semiconductor device having a mark opening portion such as an alignment mark and an overlay mark, a BPSG film formed by patterning on this mark opening portion interposing a first conductive film is covered by a second conductive film; and the BPSG film serves as a core of a cylindrical storage node and is removed after the second conductive film is formed in a shape of sidewall by a vapor phase HF treatment process, whereby a conductive contaminant is not peeled off at the time of removing the BPSG film, wherein a drop of yield can be restricted.

5 Claims, 9 Drawing Sheets

SEMICONDUCTOR DEVICE AND METHOD OF PRODUCING SAME

BACKGROUND OF THE INVENTION

1. Field of the Invention

The present invention relates to a semiconductor device having an alignment mark or an overlay mark for an overlay accuracy inspection using a vapor phase HF treatment process in a manufacturing process of a cylindrical storage node thereof, and a method of producing the semiconductor device.

2. Discussion of Background

In a semiconductor device such as a DRAM in which large-scale integration is required, microminiaturization of a memory cell is an indispensable technique and it is necessary to maintain capacitance of capacitors besides the microminiaturization of the elements. Accordingly, a method of increasing an area of stack electrodes by adopting a three-dimensional structure like a cylinder, a fin or a tunnel for the shape of stack electrodes was examined. A DRAM having a cylindrical capacitor is described in the below.

FIG. 9 is a cross-sectional view of the cylindrical capacitor constituting a DRAM memory cell formed by a conventional method of producing semiconductor device disclosed in Japanese Unexamined Patent Publication No. Hei 6-196649 (JP-A-6-196649).

In FIG. 9, numeral 101 designates a semiconductor substrate; numeral 102 designates a boro-phosho silicate glass (BPSG) film laminated on a surface of the semiconductor substrate 101; numeral 103 designates a silicon oxide film laminated on a surface of the BPSG film 102 by a CVD method, through the BPSG film 102 and the silicon oxide film 103 a storage node contact 104 made of a conductive film is formed so as to be in contact with an impurity region formed on a surface region of the semiconductor substrate 101. Further, a storage node 105 in a cylindrical shape which extends in the vertical direction and be in contact with an upper portion of the storage node contact 104 while hanging over an upper surface of the silicon oxide film 103 is formed. Further, on a surface of the storage node 105, an upper electrode 107 is laminated interposing a dielectric film 106, wherein a cylindrical capacitor 108 is fabricated by the storage node 105, the dielectric film 106 and the upper electrode 107.

In a case that the semiconductor device shown in FIG. 9 was formed, after the storage node contact 104 was formed, a conductive material constituting a bottom portion of the storage node 105 was patterned. When a mask pattern necessary for the patterning is formed by a photomechanical process, it is indispensable to align the surface of the semiconductor substrate 101 using an alignment mark thereon. Also, in order to obtain the semiconductor device having a good formation, it is indispensable to form an overlay mark in the semiconductor substrate 101 and to inspect an overlay accuracy thereby.

In the next, the method of producing the cylindrical capacitor shown in FIG. 9 is described in reference of FIGS. 10a through 10f. Further, a method of forming the alignment mark which is formed simultaneously is described in reference of these figures as a conventional technique. In FIGS. 10a through 10f, the left halves show a memory cell region having a cylindrical capacitor; and the right halves show a mark region having a mark opening portion which will be an alignment mark or an overlay mark.

As shown in FIG. 10a, on the surface of semiconductor substrate 101, the BPSG film 102 and the silicon oxide film 103 are successively laminated, and a resist pattern 109 having openings corresponding to a storage node contact hole 110 and a mark opening portion 111 is formed thereon. Further, the silicon oxide film 103 and the BPSG film 102 are subjected to an anisotropic etching using the resist pattern 109 as etching mask to thereby make the storage node contact hole 110 and the mark opening portion 111.

The opening diameter of storage node contact hole 110 is about 0.3 $\mu$m; the opening diameter of mark opening portion 111 is about 4 $\mu$m; and the plan view of the opening portions is in a rectangular shape.

In the next, as shown in FIG. 10b, the resist pattern 109 is removed and a phosphorus doped polysilicon 112 is laminated on the surface of silicon oxide film 103 so as to fill the inside of storage node contact hole 110, whereby a storage node contact 104 is obtainable. At this time, the phosphorus doped polysilicon 112 is similarly laminated in the inner wall of mark opening 111 simultaneously. The surface shape of phosphorus doped polysilicon laminated in the mark opening portion 111 becomes concave in accordance with the shape of mark opening portion 111.

Further, a BPSG film 113 is laminated to obtain a film thickness corresponding to the vertical dimension of the cylindrical capacitor. A resist pattern 114a having a shape corresponding to a bottom portion of the storage node 105 and a resist pattern 114b having a shape covering the mark opening portion 111 are formed above the phosphorus doped polysilicon 112.

Thereafter, as shown in FIG. 10c, the BPSG film 113 and the phosphorus doped polysilicon 112 are continuously subject to a dry etching using the resist pattern 114a and the resist pattern 114b as etching mask to obtain the patterned phosphorus doped polysilicon 112a, the patterned BPSG film 113a, the patterned phosphorus doped polysilicon 112b and the patterned BPSG film 113b, respectively having shapes corresponding to the etching masks.

In the next, as shown in FIG. 10d, a phosphorus doped polysilicon 115 is laminated until it has a predetermined film thickness; and further the phosphorus doped polysilicon 115 is subject to an anisotropic etching as shown in FIG. 10e to thereby obtain a sidewall 115a made of a conductive material in the sidewalls of BPSG film 113a and the side of phosphorus doped polysilicon 112a. At the same time, in the mark region, a sidewall 115b deposited on the side of the BPSG film 113b and the side of the phosphorus doped polysilicon 112b are formed and a sidewall 116 are formed on a surface of BPSG film 113b.

Thus the cylindrical storage node 105 is fabricated by the sidewall 115a and the phosphorus doped polysilicon 112a, and the mark 117 is fabricated by the sidewall 115b and the phosphorus doped polysilicon 112b.

In the next, as shown in FIG. 10f, the BPSG film 113 is removed by a vapor phase HF treatment process.

By forming the dielectric film 106 and the upper electrode 107 respectively, it is possible to make the cylindrical capacitor 108.

However, as mentioned in the above, when the mark 117 was formed in the process of forming the cylindrical capacitor 108, the sidewall 116 formed in the mark region in the prior step was lifted off at the time of vapor phase HF treatment process as shown in FIG. 10f. Accordingly, there was a problem that a plurality of elements which should have been electrically insulated were shorted when the lifted-off sidewall 116 was deposited again on the memory cell because the sidewall was made of the conductive material, wherein yield was dropped.

Also there was a problem of a drop of yield caused by the lift-off of the conductive material like sidewall in forming the overlay mark.

Another technique of forming an alignment mark is disclosed in Japanese Unexamined Patent Publication No. Hei 7-142379 (JP-A-7-142379).

This technique is to solve inconvenience that a circuit pattern is shorted by a deposition of a peeled-off aluminum alloy in an active element region by preventing the aluminum alloy from remaining in an inner wall of opening as sidewall in a later step of forming wiring when the area of opening of an alignment mark is as much as 4 μm×4 μm or 4 μm×2 μm.

According to this technique, the shape of opening of the alignment mark is formed by assembling a plurality of micro openings; the size of one side of the micro openings is 1 μm or less; the opening portion is completely filled in at a stage of laminating the wiring of aluminum alloy; and the sidewall made of the conductive film is not formed in an alignment mark region when the wiring is patterned.

SUMMARY OF THE INVENTION

It is an object of the present invention to solve the above-mentioned problems inherent in the prior art and to provide a semiconductor device in which a conductive sidewall causing a drop of yield is not formed when a vapor phase HF treatment process is used in a process of forming an alignment mark for forming a cylindrical capacitor of DRAM and in a process of forming an overlay mark used for an overlay accuracy inspection, and also to provide a method of producing such a semiconductor device.

According to a first aspect of the present invention, there is provided a semiconductor device having a mark opening portion, characterized by a first conductive film and a BPSG film are successively laminated in the inner wall and the bottom surface of the mark opening portion; and a second conductive film covers the surface of BPSG film.

According to a second aspect of the present invention, there is provided a semiconductor device, wherein the maximum size of opening in the mark opening portion is the same as or larger than two times of the sum of the film thickness of first conductive film and the film thickness of BPSG film.

According to a third aspect of the present invention, there is provided a semiconductor device having a mark opening portion formed in a single micro opening pattern or a set of plural micro opening patterns, comprising a first conductive film laminated in the inner wall and the bottom surface of the micro opening pattern and a second conductive film in a cylindrical shape formed by surrounding the outer periphery of the first conductive film and extending in the vertical direction, wherein the size of opening of the micro opening pattern is the same as or smaller than two times of the size of the second conductive film in the height direction.

According to a fourth aspect of the present invention, there is provided a semiconductor device according to the third aspect of the invention, wherein the micro opening pattern is formed to have a size corresponding to a contact hole formed in the identical semiconductor device.

According to a fifth aspect of the present invention, there is provided a semiconductor device according to the third aspect of the invention, wherein the micro opening pattern is in a slit-like shape.

According to a sixth aspect of the present invention, there is provided a semiconductor device comprising a stopper film formed in an insulating film on a substrate, a first conductive film formed in a region including the inner wall and the bottom surface of a mark opening, and a second conductive film in a cylindrical shape formed by surrounding the outer periphery of the first conductive film and extending in the vertical direction.

According to a seventh aspect of the present invention, there is provided a method of producing semiconductor device comprising a step of laminating an insulating film in a substrate having a first region and a second region, a step of opening a contact hole penetrating the insulating film in the first region and of opening a mark opening portion in the second region, a step of laminating the first conductive film with which the contact hole is filled, a step of laminating a BPSG film in the first conductive film, a step of forming etching masks respectively on a region covering the contact hole in the BPSG film and a region covering the mark opening portion, a step of patterning the BPSG film and the first conductive film by an anisotropic etching using the etching mask and of removing the etching masks, a step of laminating a second conductive film by a CVD method, a step of patterning a mask in a region covering the mark opening portion, a step of obtaining sidewall made of the second conductive film depositing on the side of the BPSG film and the side of the first conductive film in the first region by an anisotropic etching in the second conductive film using the mask as an etching mask and simultaneously of removing a part of the second conductive film exists on the region without the mask in the second region, a step of removing the mask, and a step of selectively removing the BPSG film in the first region by a vapor phase HF treatment process, wherein the first conductive film and the sidewall in the first region constitute a cylindrical storage node.

According to an eighth aspect of the present invention, there is provided a method of producing a semiconductor device comprising a step of laminating an insulating film on a substrate having a first region and a second region, a step of opening a contact hole penetrating the insulating film in the first region and a mark opening portion in the second region respectively, a step of laminating a first conductive film with which the contact hole is filled, a step of laminating a BPSG film having a flat surface on the first conductive film, a step of forming etching masks respectively in a region covering the contact hole in the BPSG film and a region covering the mark opening portion, a step of patterning the BPSG film and the first conductive film by an anisotropic etching using the etching mask and of removing the etching masks, a step of laminating a second conductive film by a CVD method, a step of forming sidewalls made of the second conductive film on the sides of the BPSG film and the sides of the first conductive film respectively in the first region and the second region by performing an anisotropic etching in the second conductive film, and a step of removing the BPSG film by a vapor phase HF treatment process, wherein the first conductive film and the sidewall in the first region constitute a cylindrical storage node.

According to a ninth aspect of the present invention, there is provided a method of producing a semiconductor device according to the eighth aspect of the invention, wherein the mark opening portion is formed by a single slit-like opening, a plurality of slit-like openings, a single micro opening pattern or a plurality of micro opening patterns; and the width of the slit of slit-like opening or the opening size of the micro opening pattern in a plan view is adjusted to be smaller than two times of the sum of the film thickness of first conductive film and the film thickness of BPSG film.

According to a tenth aspect of the present invention, there is provided a method of producing a semiconductor device according to the ninth aspect of the invention, wherein the micro opening pattern is formed to have a size corresponding to the contact hole in the identical semiconductor device.

According to an eleventh aspect of the present invention, there is provided a method of producing a semiconductor device comprising a step of laminating an insulating film on a substrate having a first region and a second region, a step of forming a stopper film in the insulating film of the second region, a step of opening a contact hole penetrating the insulating film of the first region and simultaneously of opening a mark opening portion in the insulating film of the second region by the depth of from the surface of insulating film to the surface of stopper film, a step of laminating a first conductive film with which the contact hole is filled, a step of laminating a BPSG film on the first conductive film, a step of forming etching masks respectively in a region covering the contact hole in the BPSG film and in a region covering a region having the mark, a step of patterning by an anisotropic etching in the BPSG film and the first conductive film using the etching masks and of removing the etching masks, a step of laminating a second conductive film by a CVD method, a step of forming sidewalls made of the second conductive film on sides of the BPSG films and the first conductive films respectively in the first region and the second region using an anisotropic etching in the second conductive film, a step of removing the BPSG films by a vapor phase HF treatment process, wherein the first conductive film and the sidewall in the first region constitute a cylindrical storage node.

According to a twelfth aspect of the present invention, there is provided a method of producing a semiconductor device according to the eleventh aspect of the invention, wherein, after the step of forming the sidewalls using the anisotropic etching in the second conductive film, an overetching is provided in the second conductive film to remove the second conductive film by a film thickness corresponding to a depth of from the surface of insulating film to the surface of stopper film.

According to a thirteenth aspect of the present invention, there is provided a method of producing a semiconductor device according to the seventh, the eighth, the ninth or the eleventh aspect of the invention, wherein when the etching masks are formed in the region covering the contact hole in the BPSG film and the region covering the mark opening portion, the mark opening in the second region is used as an alignment mark.

According to a fourteenth aspect of the present invention, there is provided a method of producing a semiconductor device according to the seventh aspect, the eighth aspect, the ninth aspect or the eleventh aspect of the invention, wherein the mark opening portion is used as an overlay mark for an overlay accuracy inspection.

BRIEF DESCRIPTION OF THE DRAWINGS

A more complete appreciation of the invention and many of the attendant advantages thereof will be readily obtained as the same becomes better understood by reference to the following detail description when considered in connection with the accompanying drawings, wherein.

DETAILED DESCRIPTION OF THE PREFERRED EMBODIMENTS

Now, the present invention will be described in further detail with reference to Examples. However, it should be understood that the present invention is by no means restricted to such specific Examples.

EXAMPLE 1

Figure 1:
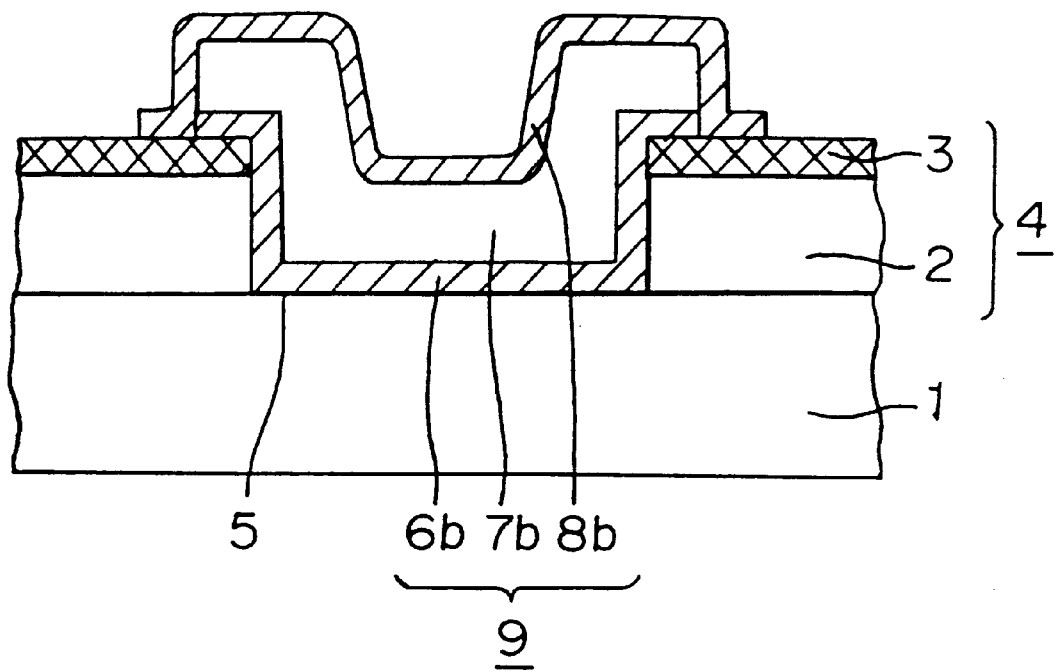
FIG. 1 is a cross-sectional view for schematically showing a part of the semiconductor device according to Example 1.

FIG. 1 shows a cross-sectional structure of a semiconductor device produced by Example 1 of the present invention, wherein a mark of an alignment mark or a mark of an overlay mark is shown.

In FIG. 1, numeral 1 designates a semiconductor substrate; numeral 2 designates an inter-layer insulating film made of a BPSG laminated on the semiconductor substrate 1; and numeral 3 designates a silicon oxide film laminated on the inter-layer insulating film 2 by a CVD method, wherein an insulating film 4 is composed of the inter-layer insulating film 2 and the silicon oxide film 3. Numeral 5 designates an opening which opens from the front surface of the insulating film 4 toward the bottom surface thereof and is opened simultaneously with opening of a storage node contact hole in the semiconductor substrate 1. For example, the opening has a rectangular shape in a plan view, and the size of one side is about several μm. The shape of opening can be changed in accordance with a device to which the present invention it to be applied.

Numeral reference 6b designates a first conductive film made of a phosphorus doped polysilicon laminated on the bottom surface of opening 5, the inner wall of opening 5 and a surface of the insulating film 4 at the periphery of opening 5; numeral reference 7b designates a BPSG film laminated on the first conductive film 6b; and numeral reference 8b designates a second conductive film made of a phosphorus doped polysilicon which is laminated so as to cover the surface of BPSG film 7b. The first conductive film 6b, the BPSG film 7b and the second conductive film 8b constitute a mark 9.

The first conductive film 6b is a conductive film which is laminated simultaneously with the lamination of the conductive material constituting a bottom surface portion of a storage node contact and also constituting a cylindrical storage node. Similarly, the BPSG film 7b is a film laminated simultaneously with the lamination of the BPSG film formed on the bottom surface of a cylindrical capacitor in order to deposit a sidewall when a cylindrical portion of cylindrical capacitor is formed. Also the second conductive film 8b is a conductive film laminated simultaneously with the lamination of material which is to be a conductive sidewall and constitutes an upper portion of the cylindrical capacitor.

In a process of forming the mark shown in FIG. 1, the BPSG film 7b is not removed and, therefore, a conductive sidewall is not formed on a surface of the BPSG film 7b, whereby the yield is not dropped.

In the next, a manufacturing process flow of the semiconductor device shown in FIG. 1 is described with reference to FIGS. 2a through 2f. In the left of FIGS. 2a through 2f, steps of producing a memory cell region are shown and in the right thereof, steps of producing a mark region is shown.

Figure 2A:
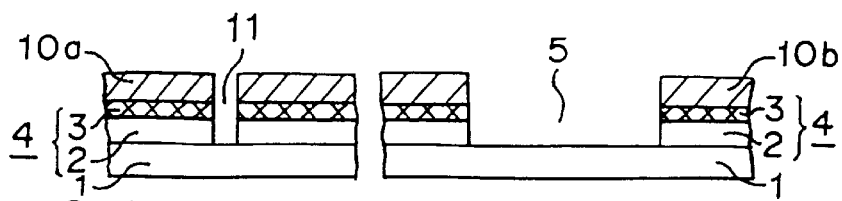
FIGS. 2(a)–2(f) schematically shows steps of producing the semiconductor device according to Example 1.

At first, as shown in FIG. 2a, an inter-layer insulating film 2 made of a BPSG is laminated on a semiconductor substrate 1 to have a film thickness of about 5,000 Å by an atmospheric pressure CVD method; and a silicon oxide film 3 is laminated to have a film thickness of about 500 Å in an upper layer by a low pressure CVD (LPCVD) method, whereby an insulating film 4 is obtainable. In the next, a mark opening portion 5 is formed in the mark region by a dry etching using resist patterns 10a, 10b simultaneously with opening of a storage node contact hole 11 in the identical semiconductor substrate 1. The mark opening portion 5 will be an alignment mark or an overlay mark.

Figure 2B:
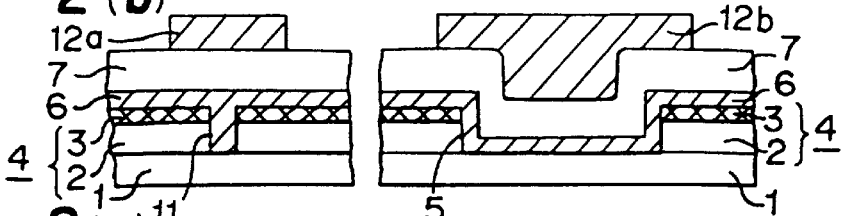

In the next, as shown in FIG. 2b, after the resist patterns 10a, 10b are removed, a first conductive film 6 made of a phosphorus doped polysilicon having a film thickness of about 1,000 Å through 2,000 Å is laminated; and the inside of storage node contact hole 11 is filled with this conductive material, whereby a storage node contact is obtainable. Further, a BPSG film 7 is laminated to have a film thickness of about 4,000 Å through 8,000 Å. A surface shape of the BPSG film 7 is along the inner wall of mark opening portion 5 in the mark region.

Further, a resist film is laminated by a rotational coating; and resist patterns 12a, 12b are respectively patterned in the memory cell region and the mark region by a photoengraving. The shape of resist pattern 12a corresponds to a bottom portion of cylindrical storage node which will be formed consequently. And the shape of resist pattern 12b has a size by which the mark opening portion 5 can be covered.

Figure 2C:
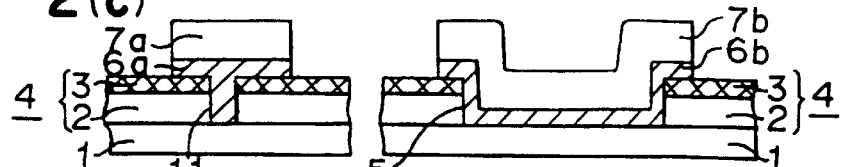

In the next, as shown in FIG. 2c, the BPSG film 7 and the first conductive film 6 are subject to an anisotropic etching successively using the resist patterns 12a, 12b as an etching mask, whereby first conductive films 6a, 6b and BPSG films 7a, 7b respectively corresponding to the mask shapes are obtainable. Then the resist patterns 12a, 12b are removed.

Figure 2D:
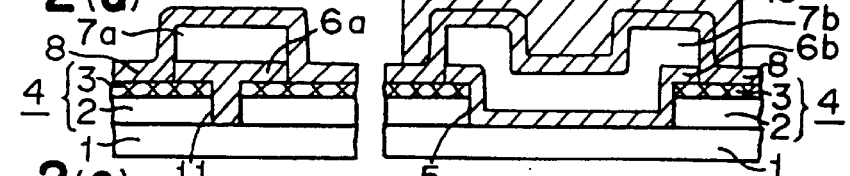

In the next, as shown in FIG. 2d, a second conductive film 8 made of a phosphorus doped polysilicon is laminated to have a film thickness of about 500 Å through 1,000 Å by a LPCVD method, and a resist pattern 13 is patterned so as to cover the mark opening portion 5.

Figure 2E:
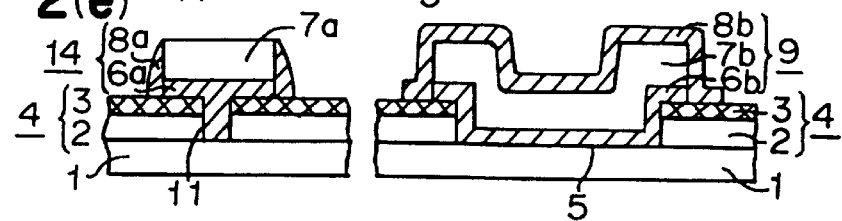

Further, as shown in FIG. 2e, the polysilicon is subject to an anisotropic etching while leaving a conductive sidewall on the side of BPSG film 7a in the memory cell region so as to form a cylindrical portion 8a fabricating a cylindrical storage node 14. The cylindrical storage node 14 is composed of the cylindrical portion 8a and the first conductive film 6a. In the mark region, a part of the second conductive film 8 exists in an area other than where the resist pattern 13 is formed is removed by an etching, whereby the second conductive film 8b having a shape corresponding to the resist pattern 13 is left. The second conductive film 8b, the BPSG film 7b and the first conductive film 6b fabricate a mark 9. Thereafter, the resist pattern 13 is removed.

Figure 2F:
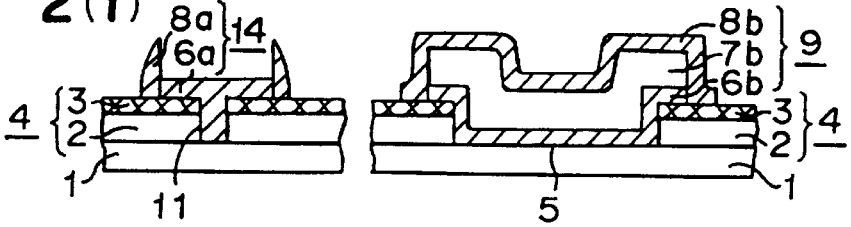

In the next, as shown in FIG. 2f, a vapor phase HF treatment process is conducted in order to selectively remove the BPSG film 7a, whereby the cylindrical storage node 14 is obtainable. This vapor phase HF treatment process is conducted under a condition that the partial pressure of HF is 600 Pa; the partial pressure of $H_2O$ is 300 Pa; and the treatment is continued for 5 minutes. Under this condition, an etch rate of the silicon oxide film laminated by the atmospheric pressure CVD method is 10 Å/min and an etch rate of the BPSG film is 1 $\mu$m/min. Therefore, it is possible to selectively etch the BPSG film 7a which works as a core of the cylindrical portion without etching the inter-layer insulating film 2 made of a BPSG constituting the insulating film 4 below the cylindrical storage node 14.

In the vapor phase HF treatment process, because the BPSG film 7 fabricating the mark 9 is covered by the second conductive film 8b, the BPSG film 7 is not removed and a conductive sidewall is not formed on the surface of BPSG film 7b, whereby it is possible to restrict a drop of yield caused by peeling of conductive sidewall at the time of vapor phase HF treatment process which has been occurred in the conventional technique can be restricted.

Incidentally, the material made of BPSG can be substituted by other insulating materials in order to constitute the inter-layer insulating film. Also, it is needless to say that the other components can be substituted by materials having the similar property to the components.

EXAMPLE 2

In Example 1, the shape of mark opening portion 5 which will be an alignment mark or an overlay mark is exemplified as having a relatively large opening diameter as much as the opening is not filled completely with the lamination of the first conductive film 6b afterwards.

In Example 2, a semiconductor device in which one of mark opening portions has an opening diameter which can be filled with a conductive film (corresponding to the first conductive film 6b in Example 1) to be laminated in the following step and a set of openings composed of a plurality of mark opening portions fabricates an alignment mark or an overlay mark is described.

Figure 3:
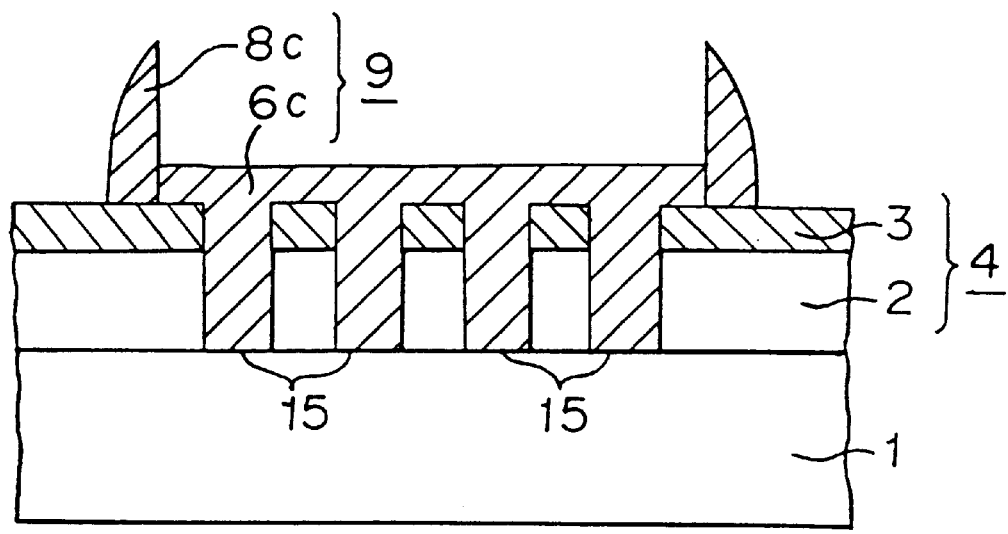
FIG. 3 is a cross-sectional view for schematically showing a part of the semiconductor device according to Example 2.

FIG. 3 is a cross-sectional view of a portion formed with a mark in the semiconductor device according to Example 2, wherein numeral 15 designates mark opening portions in a slit-like shape which are opened in an insulating film 4, wherein the set of the plurality of mark opening portions 15 fabricates an alignment mark or an overlay mark. Numeral 6c designates a first conductive film made of, for example, a phosphorus doped polysilicon, which fills the insides of the mark opening portions 15 and is laminated on a surface of the insulating film 4. Numeral 8c designates a cylindrical portion made of, for example, a phosphorus doped polysilicon, which has a shape of surrounding the peripheral portion of first conductive film 6c and of extending in the vertical direction, wherein the first conductive film 6c and the cylindrical portion 8c fabricates a mark 9. The same numerals reference as those have been used for the description in the above designate the same or the similar portions.

In the mark opening portions 15, a plurality of slits extending in one direction are arranged side by side, wherein the silt width of each mark opening is smaller than two times of the sum of the film thickness of the first conductive film 6c and the film thickness of a BPSG film (corresponding to the BPSG film 7b in Example 1) which will be laminated in the following step. By determining the first conductive film 6c and the slit width of mark opening portions 15, the insides of mark opening portions 15 can completely be filled at the stage that the first conductive film 6c is laminated. Accordingly, as shown in FIG. 3, it is possible to make the surface of first conductive film 6c above the mark opening portions 15 flat or substantially flat, whereby it is possible to restrict a drop of yield after the following steps are finished, because a sidewall made of a conductive material, which causes the problem in the conventional technique, is not formed.

In the next, a method of producing the semiconductor device shown in FIG. 3 is described with reference to FIGS. 4a through 4f.

Figure 4A:
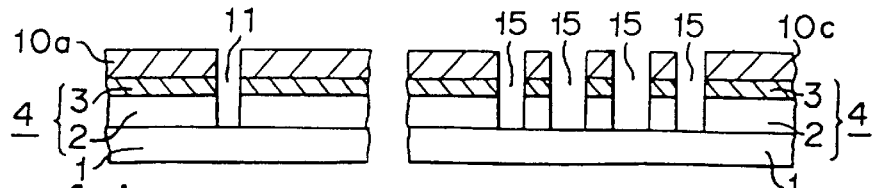
FIGS. 4(a)–4(f) schematically shows steps of producing the semiconductor device according to Example 2.

At first, as shown in FIG. 4a, an insulating film 4 is laminated on a semiconductor substrate 1 as in Example 1. Then, a resist pattern 10a having a pattern of shape of a storage node contact hole 11 and a resist pattern 10c having a pattern of shape of arranging a plurality of mark opening portions 15 are formed; and the insulating film 4 is subject to an anisotropic etching using the resist patterns 10a and 10c as an etching mask, whereby an alignment mark or an overlay mark fabricated by the storage node contact hole 11 and the plurality of mark opening portions 15 is obtainable.

Figure 4B:
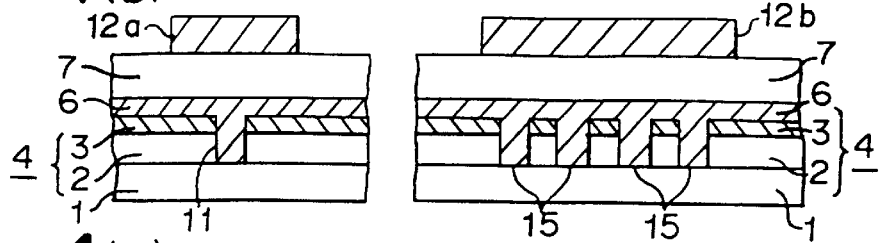

Further, as shown in FIG. 4b, a first conductive film 6 made of a phosphorus doped polysilicon is laminated so as to have a film thickness of about 1,000 Å through 2,000 Å by a LPCVD method after the resist patterns 10a and 10c are removed. Then, a BPSG film 7 is laminated to have a film thickness of about 4,000 Å through 8,000 Å in an upper layer of the first conductive film 6. When the BPSG film 7 is formed, the surface thereof becomes flat. In FIG. 4b, a case that the mark opening portions 15 are completely filled at a stage that the first conductive film 6 is laminated is exemplified. However, it is possible to fill the mark opening portions 15 at a stage of forming the BPSG film 7 in the following step in order to make the surface flat. In Example 2, it is possible to make the surface of a portion of BPSG film 7b corresponding to a mark 9 if the slit width of the mark opening portions 15 is 1 μm or less because the film thickness of first conductive film 6 is made to be at least 1,000 Å; the film thickness of BPSG film 7 is made to be at least 4,000 Å; and the sum of the film thicknesses is made to be at least 5,000 Å after the mark opening portions 15 are opened.

Further, in the BPSG film 7, a resist pattern 12a having a shape of a bottom surface portion of storage node 14 is formed in a memory cell, and a resist pattern 12b having a shape corresponding to the mark 9 is formed in a mark region.

Figure 4C:
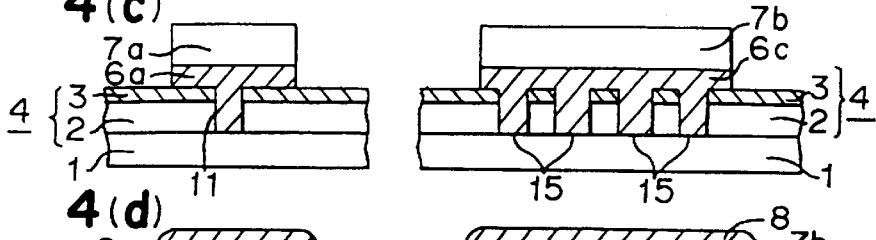

In the next, as shown in FIG. 4c, the BPSG film 7 and the first conductive film 6 are successively subject to an anisotropic etching using a silicon oxide film 3 as an etching stopper and the resist patterns 12a and 12b as an etching mask, whereby BPSG films 7a, 7b and first conductive films 6a, 6c having shapes corresponding to the respective etching masks are obtainable. The resist patterns 12a, 12b are removed.

Figure 4D:
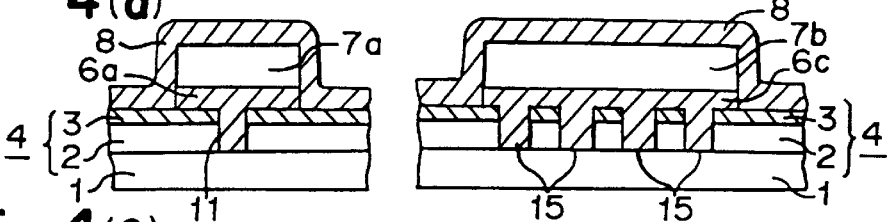

Further, as shown in FIG. 4d, a second conductive film 8 made of, for example, a phosphorus doped polysilicon is laminated to have the film thickness of about 1,000 Å through 2,000 Å by a LPCVD method.

Figure 4E:
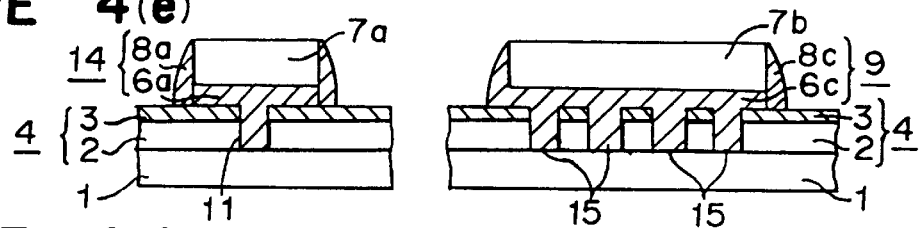

Further, as shown in FIG. 4e, the whole surface of second conductive film 8 is subject to an anisotropic etching to obtain sidewalls made of the phosphorus doped polysilicon on the side of BPSG film 7a and the side first conductive film 6a and on the side of the BPSG film 7b and the side of first conductive film 6c, a cylindrical portion 8a of storage node specifically in the memory cell region, a cylindrical portion 8c fabricating the mark 9 specifically in the mark region.

At this stage, the conductive materials in the surface of BPSG film 7b can completely be removed.

Figure 4F:
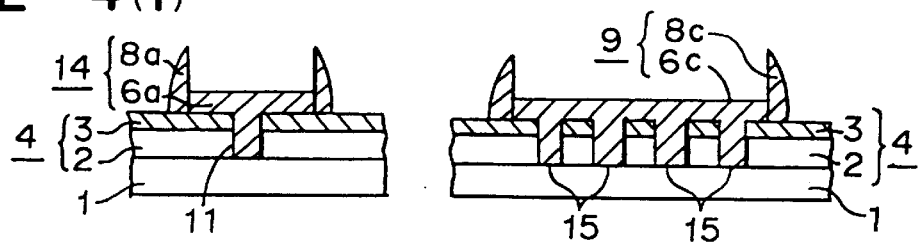

In the next, as shown in FIG. 4f, the BPSG films 7a and 7b are removed by the vapor phase HF treatment process described in Example 1, whereby a cylindrical storage node 14 is obtainable in the memory cell region and the mark 9 fabricated by the first conductive film 6c and the cylindrical portion 8c is obtainable in the mark region.

Figure 5:
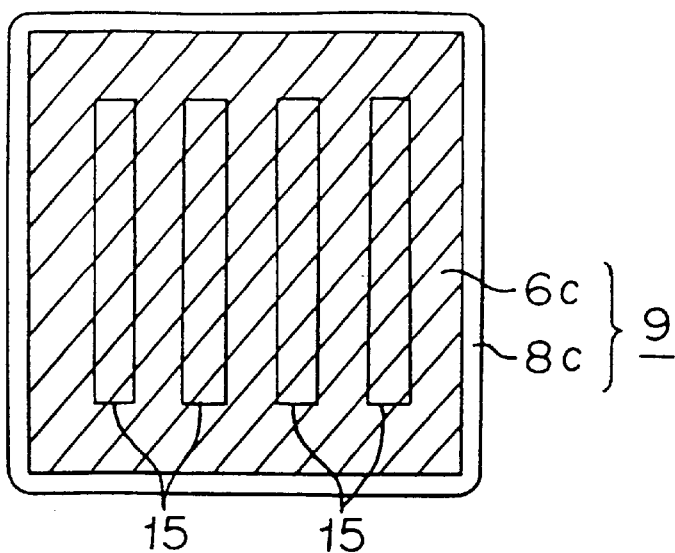
FIG. 5 is a plan view of the semiconductor device according to Example 2.

FIG. 5 is a plan view of the mark 9 in FIG. 4f, wherein the plurality of mark opening portions 15 having the same slit-like shape are arranged side by side.

Thus, when the first conductive film 6a fabricating the bottom surface portion of the storage node and the storage node contact and the BPSG film 7a formed to serve as a cylindrical core are formed, it is possible to make the surface of BPSG film 7b flat by adjusting the slit width of mark opening portions 15 in the mark region to be a smaller value than two times of the sum of the film thicknesses.

Incidentally, an example that the slit width of the mark opening portions 5 is 1 μm is described in the above. However, needless to say, it is also possible to change the slit shape to a pattern necessary for the alignment.

EXAMPLE 3

In Example 2, the alignment mark or the overlay mark is the set of the plurality of mark opening portions 15 in a slit-like shape. The difference between Example 3 and the Example 2 is that the shape of mark opening portions has a size corresponding to the shape of storage node contacts composing the memory cell in Example 3.

Figure 6:
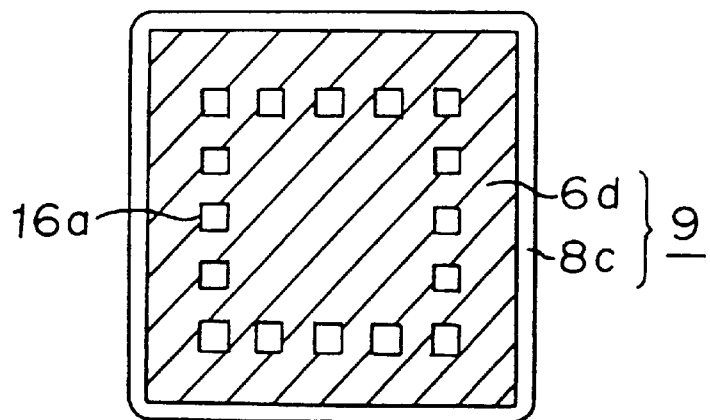
FIG. 6a is a plan view of the semiconductor device according to Example 3 of the present invention.
FIG. 6b is a plan view of the semiconductor device according to Example 3 of the present invention.
Figure 6:
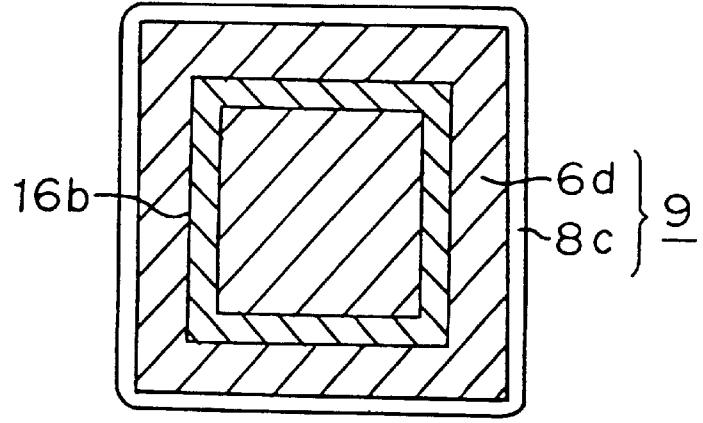

FIG. 6a is a plan view of a mark 9 at a stage that a cylindrical portion 8c is formed. Numeral reference 6d corresponds to the first conductive film 6c in Example 2, which is a film for filling opening portions of mark opening portions 16a in a shape of contact hole. The numeral references which has already been described designate the same or the similar portions.

A plurality of the mark opening portions 16a are arranged side by side and constitutes the mark in a rectangular shape as a whole.

In a case of 64M DRAM, the diameter of contact hole is formed to have a size of 0.2 μm though 0.3 μm and a permissible error is ±0.05 μm or less. Therefore, the insides of mark opening portions 16a are completely filled in and the surface of BPSG film becomes flat at a stage of laminating the first conductive film 6d and the BPSG film, which becomes a core when the cylindrical portion of storage node is formed, in the following step, whereby a sidewall made of a conductive material is not formed on the surface of BPSG film 7b at a stage shown in FIG. 4e.

Accordingly, the conductive sidewall is not peeled off even though the BPSG film, which is used as a core when the cylindrical portion of storage node is formed, is removed by a vapor phase HF treatment process, whereby a drop of yield can be prevented.

Further, in FIG. 6a, the shape of the mark opening portions 16a corresponds to the shape of storage node contact. However, as shown in FIG. 6b, it is also possible to fill in an opening completely at the stage of laminating the first conductive film 6 and the BPSG film 7 in the following step and make the surface thereof flat in a similar manner by forming a groove having an opening width corresponding to the opening diameter of storage node contact hole in a predetermined shape a rectangular shape is exemplified in the FIG. as a mark opening portion 16b. Therefore, even though a vapor phase HF treatment process is conducted when the BPSG film is removed, a conductive sidewall is not peeled, whereby a drop of yield can be prevented.

Further, an alignment with high accuracy or an overlay accuracy inspection with high accuracy can be performed because the micro opening having an opening diameter (or an opening width) as small as the contact hole is formed as the mark opening portion 16a or 16b, whereby the accuracy of dimensions can be controlled as in a memory cell.

EXAMPLE 4

In the above-mentioned Examples 1 through 3, the mark opening portions 5, 15 and 16 are formed by opening hole in the insulating film 4 in the mark region simultaneously with the opening of the storage node contact hole 11 in the memory cell region, and the depth of openings fabricating the mark opening portions corresponds to the film thickness of insulating film 4, namely the depth of storage node contact hole 11.

In Example 4, a case that the measurement in the depth direction of the openings fabricating the alignment mark or the overlay mark is smaller than the measurement in the depth direction of storage node contact hole.

Figure 7:
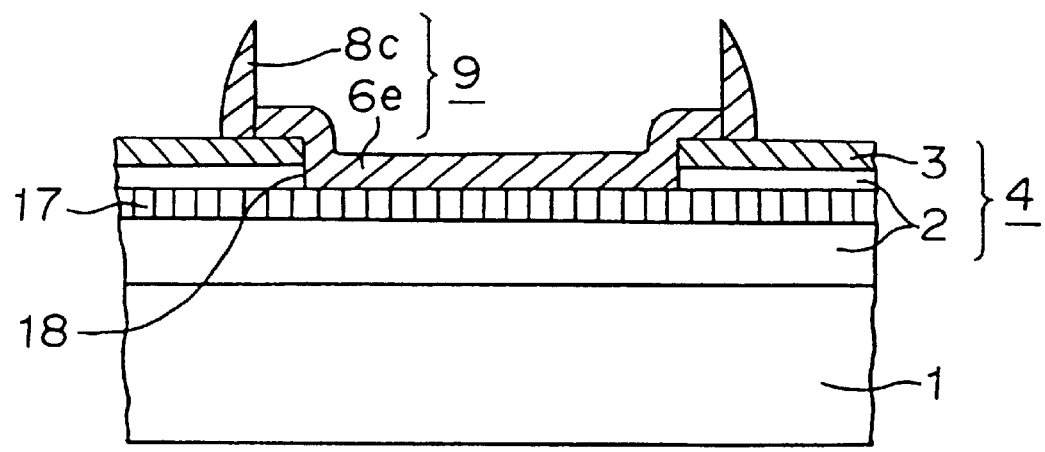
FIG. 7 is a cross-sectional view for schematically showing a part of the semiconductor device according to Example 4 of the present invention.

FIG. 7 is a cross-sectional view of the mark region of semiconductor device according to Example 4, wherein numeral reference 6e designates a first conductive film laminated in a mark opening portion 18 which is thinner than a storage node contact hole, and this first conductive film is laminated simultaneously with forming of a conductive film constituting the storage node contact and a bottom portion of a cylindrical storage node in the memory cell region.

Numeral 17 designates a stopper film formed in an inter-layer insulating film 2, which becomes an etching stopper when the mark opening portion 18 is opened. Numerals reference which has already been described designates the same or the similar portions.

In FIG. 7, the mark 9 is formed by embedding a part thereof in an upper portion of the opening because the mark opening portion 18 is not formed to penetrate the insulating film 4 and the depth of mark opening portion corresponds to a thickness of a part of the insulating film 4 placed above the stopper film 17. Accordingly, the surface of first conductive film 6e fabricating the mark 9 becomes relatively flat, and the surface of a film corresponding to a BPSG film served as a core of cylindrical portion of the storage node to be laminated thereon is also formed relatively flat. Accordingly, a sidewall made of a conductive material is not formed on the surface of BPSG film in the following step. Therefore, it is possible to restrict a drop of yield in the producing process of the semiconductor device.

In the next, a method of producing the semiconductor device having the mark 9 shown in FIG. 7 is described with reference to FIG. 8.

Figure 8A:
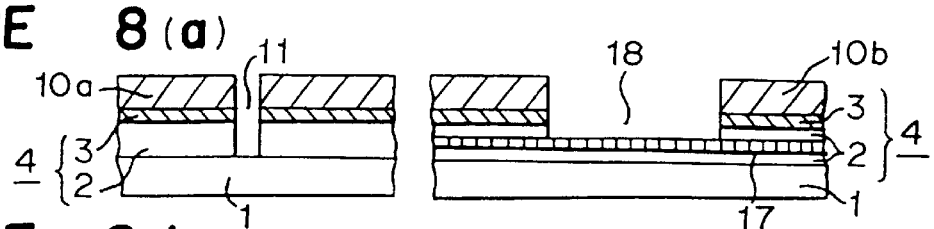
FIGS. 8(a)–8(f) schematically shows steps of producing the semiconductor device according to Example 4 of the present invention.

At first, as shown in FIG. 8a, a stopper film 17 made of a doped polysilicon is formed in an inter-layer insulating film 2 made of a BPSG in the mark region. The stopper film 17 can be obtained, for example, by patterning a conductive material to be laminated in a step of forming a word wire or a bit wire (now shown). Also, it is possible to newly form the stopper film 17. For example, the stopper film 17 is arranged such that the film thickness of a part of the insulating film 4 placed above the stopper film 17 becomes 1,000 Å at a stage that the inter-layer insulating film 2 made of the BPSG, the stopper film 17 and a silicon oxide film 3 are formed.

In the next, a mark opening portion 18 is opened in the mark region simultaneously with opening of a storage node contact hole 11. At this time, an etching is stopped at the surface of stopper film 17, and the mark opening portion 18 having a depth of about 1,000 Å from the surface of insulating film 4 is opened.

Figure 8B:
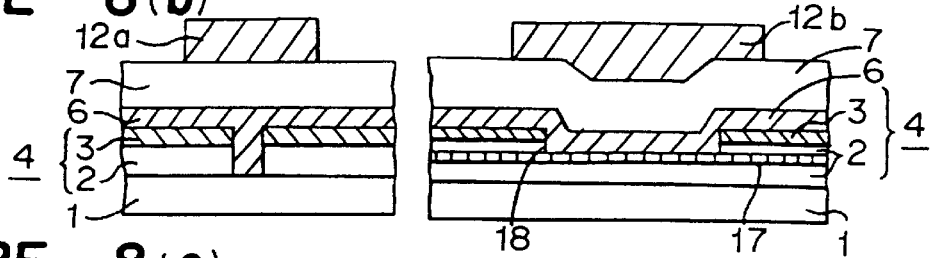

In the next, as shown in FIG. 8b, resist patterns 10a, 10b used for opening the contact hole are removed, and a first conductive film 6 made of a phosphorus doped polysilicon is laminated to have a film thickness of about 1,000 Å through 2,000 Å by a LPCVD method. Further, a BPSG film 7 is formed to have a film thickness of about 4,000 through 8,000 Å. At this time, a step formed on the surface of BPSG film 7 in the mark region is relatively small, namely smaller than 1,000 Å.

Thereafter, for example, a photo mask and a semiconductor substrate 1 are registered using the mark opening portion in the mark region as an alignment mark in order for patterning a resist pattern 12a corresponding to a bottom portion of the storage node and a resist pattern 12b corresponding to an area of covering the mark opening portion 18 in the mark region in the BPSG film 7.

Figure 8C:
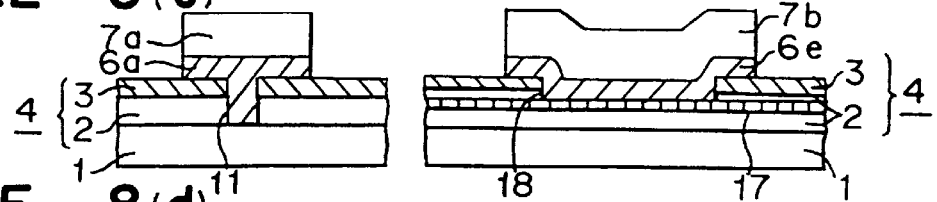

Further, as shown in FIG. 8c, the BPSG film 7 and the first conductive film 6 are subject to an anisotropic etching using the resist patterns 12a and 12b as an etching mask, wherein a BPSG films 7a, 7b and first conductive films 6a, 6b respectively corresponding to the shapes of resist patterns are obtainable. Then, the resist patterns 12a and 12b are removed.

Figure 8D:
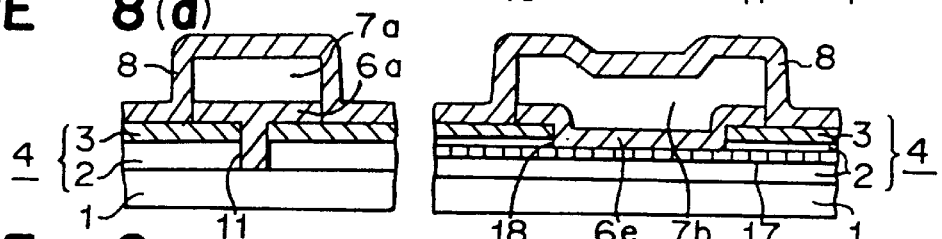

In the next, as shown in FIG. 8d, a phosphorus doped polysilicon is laminated to have a film thickness of about 1,000 Å through 2,000 Å by a LPCVD method, whereby a second conductive film 8 is obtainable.

Figure 8E:
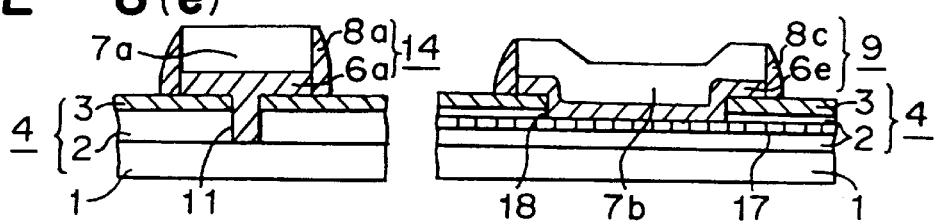

Further, as shown in FIG. 8e, the second conductive film 8 is subject to an anisotropic etching, whereby a cylindrical sidewall 14 is obtainable by forming a cylindrical portion 8a depositing on the side of first conductive film 6a and the side of BPSG film 7a in a sidewall-like shape in the memory cell region, and, simultaneously, the mark 9 is obtainable by forming a cylindrical portion 8c depositing on the side of first conductive film 6e and the side of BPSG film 7b in a sidewall-like shape in the mark region.

At this time, on the surface of BPSG film 7b, a step corresponding to the depth of opening of the mark opening portion 18 is produced, wherein the maximum size of the step is about 1,000 Å in this case. Although depending on an inclining angle of this surface step portion, when the second conductive film 8 is left at this step portion in a sidewall-like shape, the second conductive film 8 can completely be eliminated by conducting the anisotropic etching with respect to the second conductive film 8 under a condition of conducting an over etching by 1,000 Å or more, whereby a formation of the conductive sidewall on the BPSG film 7b, which causes a drop of yield, can be restricted.

Figure 8F:
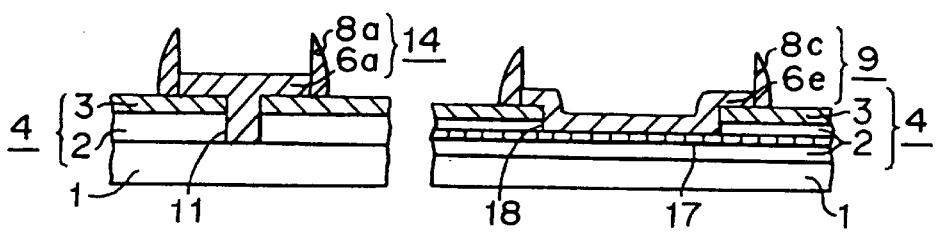
Figure 9:
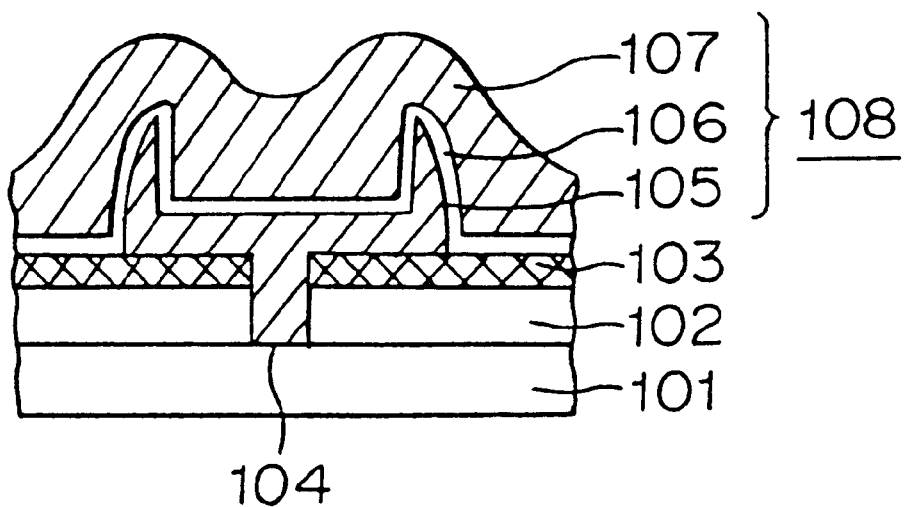
FIG. 9 is a cross-sectional view for schematically showing the conventional semiconductor device.
Figure 10A:
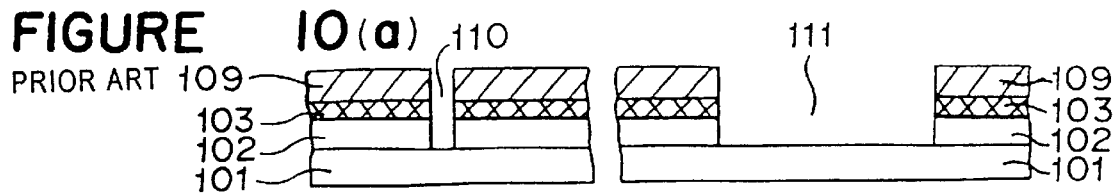
FIGS. 10(a)–10(f) schematically shows steps of producing the conventional semiconductor device.
Figure 10B:
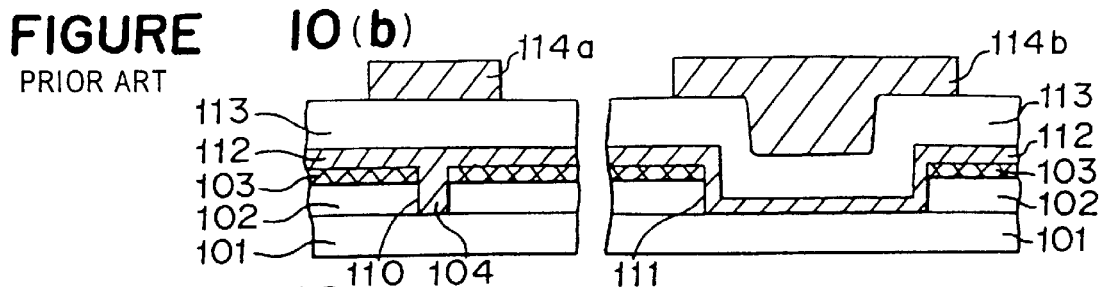
Figure 10C:
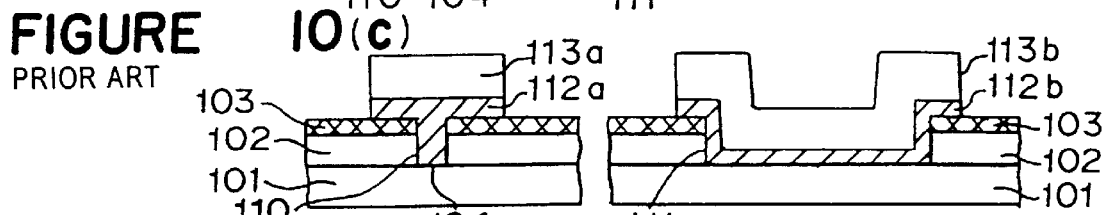
Figure 10D:
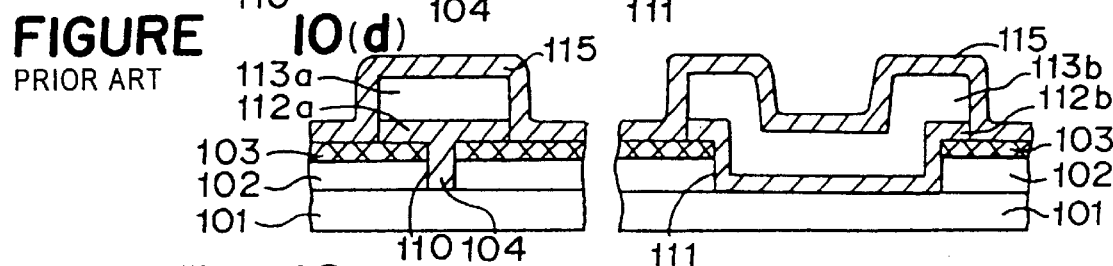
Figure 10E:
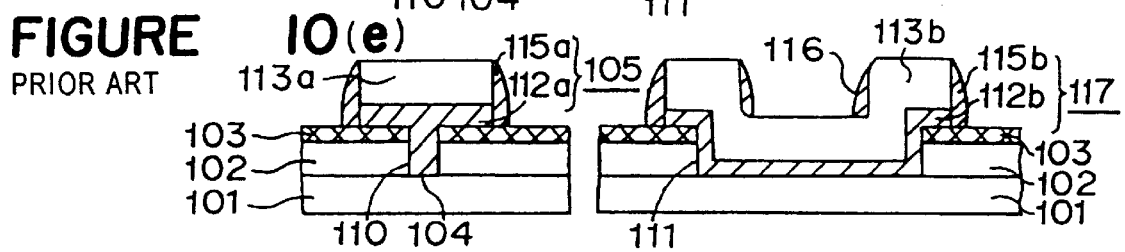
Figure 10F:
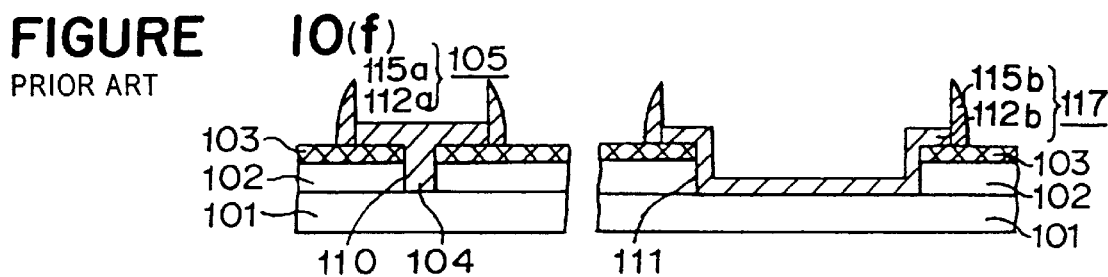

In the next, as shown in FIG. 8f, the BPSG film 7a which is a core of the cylindrical storage node 14 is removed by applying a vapor phase HF treatment process, and, simultaneously BPSG film 7b in the mark region is removed, wherein the alignment mark or the overlay mark shown in FIG. 7 is obtainable.

As described in the above, in the semiconductor device according to Example 4, the stopper film 17 is formed in the insulating film 4 as an etching stopper so that the depth of opening of the mark opening portion 18 becomes small in the step of opening the mark opening portion 18 simultaneously with the formation of the storage node contact hole 11. Accordingly, even though the mark opening portion 18 is opened simultaneously with the opening of the storage node contact hole 11, it is possible to form so as to make the mark opening portion 18 shallow and the surface shape of BPSG film 7b laminated above the mark opening portion 18 substantially flat, whereby the second conductive film 8 as the sidewall is difficult to remain in the surface of BPSG film 7b when the conductive sidewall is formed as the cylindrical portion 8a of the cylindrical storage node 14. Further, the second conductive film 8 is subject to the over etching depending on the opening depth of the mark opening portion 18, whereby a contaminant of the conductive film is not left in the BPSG film 7b, whereby a drop of yield can be restricted.

In this Example 4, a case that the mark opening portion 18 is constituted by a single relatively large opening is described. However, it is needless to say that the mark opening portion is constituted by a set of a plurality of relatively small openings. Specifically, the shape of mark opening portion 18 can be used effectively in a case that the surface of opening has a size as much as the surface is not flat at a stage of laminating the first conductive film 6e and the BPSG film 7b both laminated above the mark opening portion.

Also, a phosphorus doped polysilicon is exemplified as the material constituting the stopper film 17. However, it is not limited to a phosphorus doped polysilicon and other materials such as polycide and a silicon nitride film, as long as it is a material having a selective ratio of 3 or more at the time of processing an etching for opening the storage node contact hole 11.

The first advantage of the semiconductor device according to the present invention is to restrict generation of a conductive contaminant causing a drop of yield because the BPSG film is not removed in the following vapor phase HF treatment process by covering the BPSG film in the mark opening portion by the second conductive film.

The second advantage of the semiconductor device according to the present invention is that the BPSG film in an area corresponding to the mark opening portion is not removed and generation of a contaminant causing a drop of yield can be restricted despite a step formed in the surface of BPSG film causing generation of the contaminant of conductive sidewall at the time of forming the BPSG film because the opening size of mark opening portion is more than two times of the sum of the film thickness of first conductive film and the film thickness of BPSG film.

The third advantage of the semiconductor device according to the present invention is that it is possible to restrict generation of a conductive contaminant causing a drop of yield even after a vapor phase HF treatment process is conducted when the mark opening portion is formed along with the formation of the cylindrical storage node because the surface of BPSG film which is a core of the cylindrical storage node can be formed flat. Further, it is possible to conduct an alignment and an overlay accuracy inspection with a good dimensional accuracy because the micro opening pattern has a small opening size.

The fourth advantage of the semiconductor device according to the present invention is that an alignment and an overlay accuracy inspection can be conducted well by controlling the dimensional accuracy in the same level as a memory cell because the micro opening pattern has the same size as that of the contact hole.

The fifth advantage of the semiconductor device according to the present invention is that an alignment and an overlay accuracy inspection with a good dimensional accuracy can be conducted because the micro opening pattern can be formed in a slit-like shape and thereby a drop of yield can be restricted using this micro opening pattern.

The sixth advantage of the semiconductor device according to the present invention is that generation of a conductive contaminant causing a drop of yield can be restricted by making the surface on the mark opening portion substantially flat when the cylindrical storage node is formed simultaneously with the formation of the BPSG film as a core because the mark opening portion is formed in a shallow position which is from the surface of the insulating film to the surface of stopper film without penetrating the insulating film.

The seventh advantage of the method of producing the semiconductor device according to the present invention is that a good semiconductor device can be produced without peeling of a conductive contaminant from the mark opening portion and the yield is not dropped even when the BPSG film is removed by a vapor phase HF treatment process.

The eighth advantage of the method of producing the semiconductor device according to the present invention is that a good semiconductor device can be produced without peeling of a conductive contaminant from the mark opening portion and the yield is not dropped even when the BPSG film is removed by a vapor phase HF treatment process because the surface of BPSG film in the mark opening portion is flattened in the producing process of the semiconductor device.

The ninth advantage of the method of producing the semiconductor device according to the present invention is that a good semiconductor device can be produced without a drop of yield caused by peeling of a conductive contaminant from the mark opening portion even when the BPSG film is removed by a vapor phase HF treatment process because, in addition to the eighth advantage of the method of producing the semiconductor device, the shape of mark opening portion is the slit or the micro opening pattern; and the opening size thereof is made so that the opening can completely be filled at a stage of forming the BPSG film so as to flatten the surface of BPSG film. Further, it is possible to conduct an alignment or an overlay accuracy inspection with a high accuracy because the micro opening pattern can be used as the alignment mark or the overlay mark.

The tenth advantage of the method of producing the semiconductor device according to the present invention is that an alignment and an overlay accuracy inspection with a high accuracy can be conducted by controlling the dimensional accuracy in the same level as that in the memory cell using the micro opening pattern as the alignment mark or the overlay accuracy mark because, in addition to the ninth advantage of the method of producing the semiconductor device, the micro opening pattern is the opening having the same size as that of the contact hole.

The eleventh advantage of the method of producing the semiconductor device according to the present invention is that a good semiconductor device can be produced without peeling of a conductive contaminant from the mark opening portion when the BPSG film is removed by a vapor phase HF treatment process and the yield is not dropped because the surface of BPSG film can be flattened after the BPSG film is laminated by forming the shallow mark opening portion using the stopper film.

The twelfth advantage of the method of producing the semiconductor device according to the present invention is that the conductive film in the BPSG film can completely be eliminated because the second conductive film laminated on the BPSG film in the mark region is subject to an over etching to the extent corresponding to the depth of mark opening portion after an anisotropic etching is conducted in the second conductive film. Accordingly, a good semiconductor device can be produced without peeling of a conductive contaminant from the mark opening portion when the BPSG film is removed by a vapor phase HF treatment process and the yield is not dropped.

The thirteenth and fourteenth advantages of the method of producing the semiconductor device are that the mark opening portion can be used as the alignment mark or the overlay mark used for an overlay accuracy inspection in the methods of producing the semiconductor device corresponding to the above advantages of 7, 8, 9 and 11.

Obviously, numerous modifications and variations of the present invention are possible in light of the above teachings. It is therefore to be understood that within the scope of the appended claims, the invention may be practiced otherwise than as specifically described herein.

What is claimed is:

1. A semiconductor device having an alignment mark opening portion, characterized by:
    a first conductive film and a boro-phospho silicate glass (BPSG) film are successively laminated in the inner wall and the bottom surface of the mark opening portion; and
    a second, conductive film covers the surface of BPSG film, wherein the BPSG film is encapsulated only by the first conductive film and the second conductive film in said mark opening portion.

2. A semiconductor device according to claim 1, wherein the maximum width of opening in the mark opening portion is the same as or larger than two times of the sum of the film thickness of first conductive film and the film thickness of BPSG film.

3. A semiconductor device having an alignment mark opening portion formed in a single micro opening or a set of plural micro openings, comprising:
    a first conductive film laminated in the inner wall and the bottom surface of the micro opening or each of the micro openings and
    a second conductive film in a cylindrical shape formed by surrounding the outer periphery of the first conductive film and extending in the vertical direction, wherein
    the maximum width of opening of the micro opening is the same as or smaller than two times of the thickness of the second conductive film in the height direction.

4. A semiconductor device according to claim 3, wherein the micro opening is formed to have a width corresponding to a contact hole formed in the semiconductor device.

5. A semiconductor device according to claim 3, wherein the micro opening is in a slit-like shape.

* * * * *